(12) United States Patent
Chen et al.

(10) Patent No.: US 11,556,065 B2
(45) Date of Patent: Jan. 17, 2023

(54) WAFER STAGE AND METHOD THEREOF

(71) Applicant: TAIWAN SEMICONDUCTOR MANUFACTURING COMPANY, LTD., Hsinchu (TW)

(72) Inventors: Yu-Huan Chen, Hsinchu (TW); Yu-Chih Huang, Hsinchu (TW); Ya-An Peng, Taoyuan (TW); Shang-Chieh Chien, New Taipei (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

(\*) Notice: Subject to any disclaimer, the term of this patent is extended or adjusted under 35 U.S.C. 154(b) by 0 days.

(21) Appl. No.: 17/468,432

(22) Filed: Sep. 7, 2021

(65) Prior Publication Data

US 2022/0350263 A1 Nov. 3, 2022

Related U.S. Application Data

(60) Provisional application No. 63/181,879, filed on Apr. 29, 2021.

(51) Int. Cl.
*G03F 7/20* (2006.01)

(52) U.S. Cl.
CPC ...... *G03F 7/70775* (2013.01); *G03F 7/70033* (2013.01); *G03F 7/70725* (2013.01)

(58) Field of Classification Search
CPC ............ G03F 7/70775; G03F 7/70033; G03F 7/70725
See application file for complete search history.

(56) References Cited

U.S. PATENT DOCUMENTS 6,331,885 B1 * 12/2001 Nishi .................. G03F 7/70708
356/399
9,594,313 B2 * 3/2017 Shibazaki ............. G03F 7/7055

\* cited by examiner

*Primary Examiner* — Hung V Nguyen
(74) *Attorney, Agent, or Firm* — Maschoff Brennan

(57) ABSTRACT

A method includes moving a wafer stage to a first station on a table body of a lithography chamber; placing a wafer on a top surface of the wafer stage; emitting a first laser beam from a first laser emitter toward a first beam splitter on a first sidewall of the wafer stage, wherein a first portion of the first laser beam is reflected by the first beam splitter to form a first reflected laser beam, and a second portion of the first laser beam transmits through the first beam splitter to form a first transmitted laser beam; calculating a position of the wafer stage on a first axis based on the first reflected laser beam; after calculating the position of the wafer, moving the wafer stage to a second station on the table body; and performing a lithography process to the wafer.

20 Claims, 9 Drawing Sheets

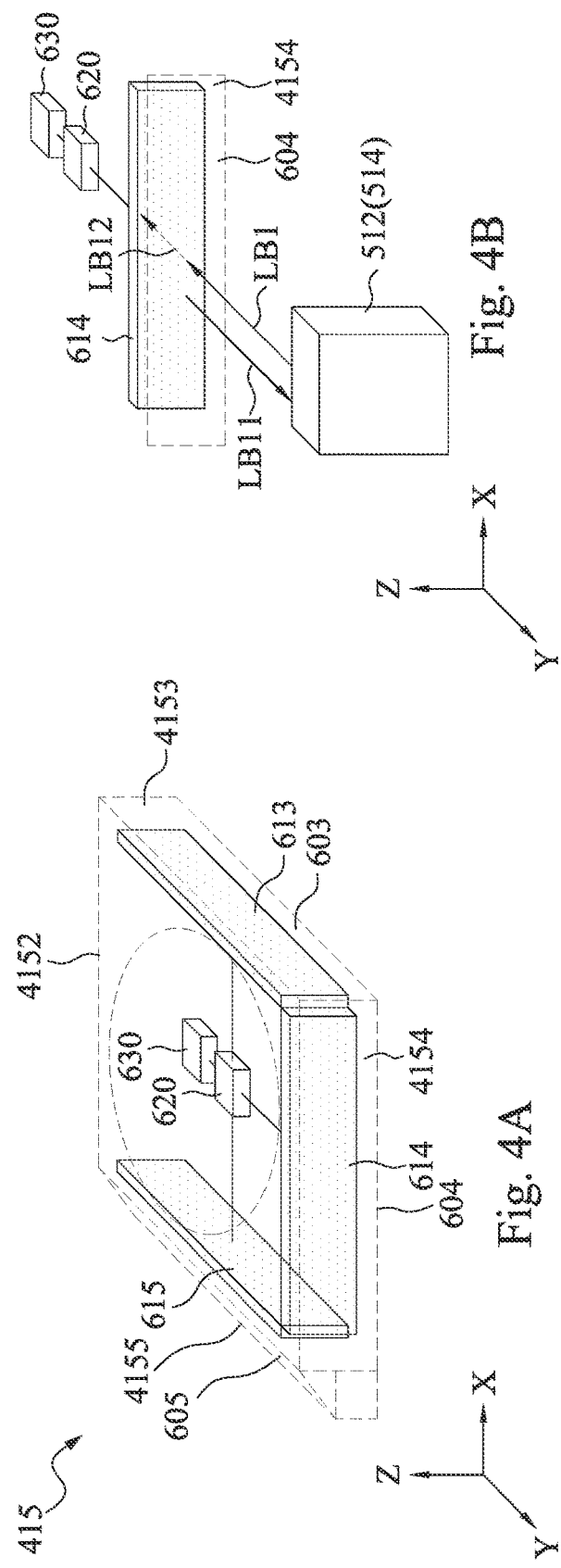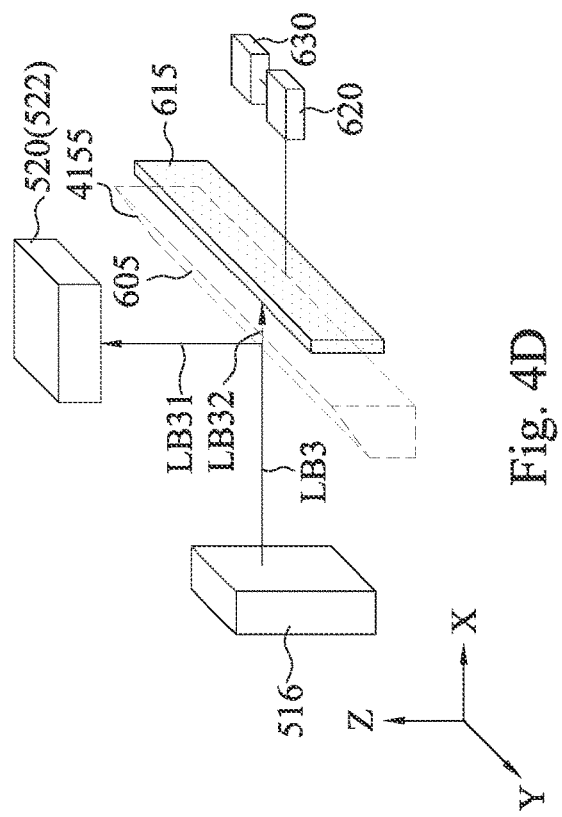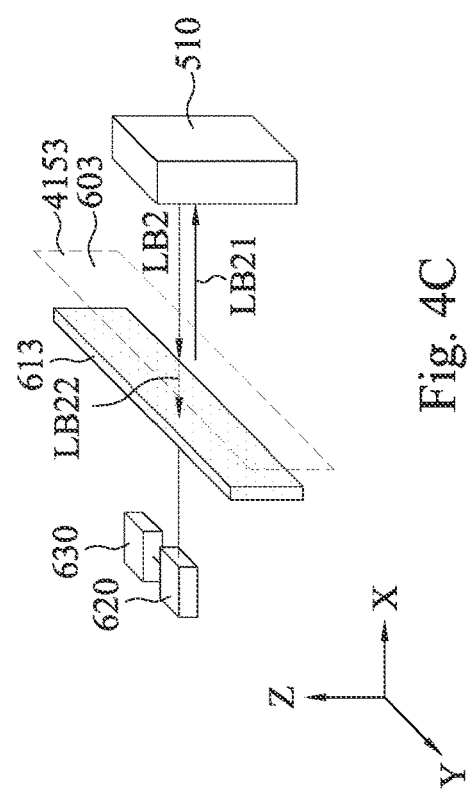

WAFER STAGE AND METHOD THEREOF

PRIORITY CLAIM AND CROSS-REFERENCE

The present application claims priority to U.S. Provisional Application Ser. No. 63/181,879, filed Apr. 29, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a schematic view of a wafer stage of a lithography chamber in accordance with some embodiments of the present disclosure.

FIG. 4B to FIG. 4D are partial views of the wafer stage of FIG. 4A in accordance with some embodiments of the present disclosure.

DETAILED DESCRIPTION

Figure 1:
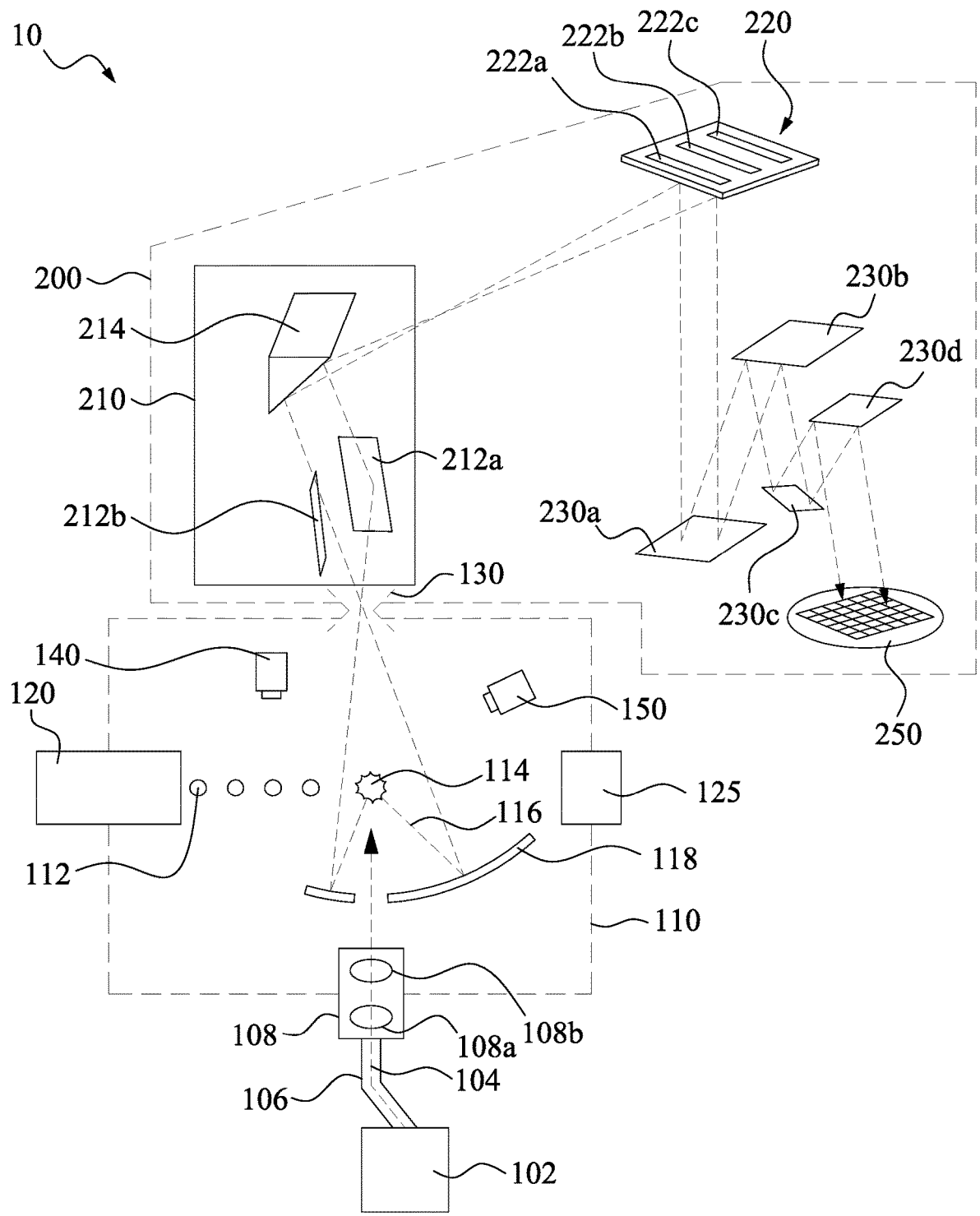
FIG. 1 is a schematic view of a lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view of lithography system in accordance with some embodiments of the present disclosure. Shown there is a EUV lithography system 10. Although the EUV lithography system 10 is illustrated as having a certain configuration of components, it will be appreciated that the disclosed lithography system 10 may include additional components (e.g., additional mirrors) or having less components (e.g., less mirrors).

The EUV lithography system 10 includes a EUV source vessel 110. A fuel droplet generator 120 is connected to the EUV source vessel 110 and is configured to generate a plurality of fuel droplets 112. In some embodiments, the fuel droplets 112 generated by the fuel droplet generator 120 are provided into the EUV source vessel 110. In some embodiments, the fuel droplets 112 may include tin (Sn). In other embodiments, the fuel droplets 112 may include a different metal material. In some embodiments, the EUV source vessel 110 can also be referred to as a radiation source, in which radiation source employs a laser produced plasma (LPP) mechanism to generate plasma and further generate EUV light from the plasma.

The EUV lithography system 10 may also include a droplet position detection system which may include a droplet imager 140 disposed in the EUV source vessel 110 that captures an image of one or more fuel droplets 112. The droplet imager 140 may provide this captured image to a droplet position detection feedback system (not shown), which can, e.g., generate a droplet position and trajectory in response to an analysis result of the captured image. The position detection feedback system can thus generate a droplet error in response to the generated droplet position and trajectory, e.g., based on a droplet-by-droplet basis, or on average. In some embodiments, the droplet imager 140 may include a fine droplet steering camera (FDSC), a droplet formation camera (DFC), and/or suitable devices.

The EUV lithography system 10 further includes a primary laser having a laser source 102 configured to produce a laser beam 104. In some embodiments, the laser source 102 may include a multi-stage laser having a plurality of stages configured to amplify laser light produced by a prior stage. The laser beam 104 passes through a beam transport system 106 configured to provide the laser beam to a focusing system 108. The focusing system 108 includes one or more lenses 108a, 108b and/or mirrors arranged within a beam line and configured to focus the laser beam 104. The laser beam 104 is output from the focusing system 108 to the EUV source vessel 110.

The laser beam 104 transmits through a collector mirror 118 located within the EUV source vessel 110. Then, the primary laser beam 104 generated by the laser source 102 intersects the fuel droplets 112. In some embodiments, the primary laser beam 104 may be a carbon dioxide ($CO_2$) laser. In other embodiments, the primary laser beam 104 may include alternative types of lasers. When the primary laser beam 104 strikes the fuel droplets 112, the primary laser beam 104 heats the fuel droplets 112 to a predetermined temperature. At the predetermined temperature, the fuel droplets 112 shed their electrons and become a plasma 114 including a plurality of ions. In some embodiments, the ions emit EUV radiation 116 (e.g., having a wavelength of approximately 13.3 nm to about 13.7 nm).

In some embodiments, the collector mirror 118 has a concave curvature. In some embodiments, the collector mirror 118 may include a multi-layer coating having alternating layers of different materials. For example, in some embodiments, the collector mirror 218 may include alternating layers of molybdenum and silicon configured to operate as a Bragg reflector. The concave curvature of the collector mirror 218 focuses the EUV radiation 116 generated by the plasma 114 toward an intermediate focus (IF) unit 130 within an exit aperture of the EUV source vessel 110. The intermediate focus unit 130 is located between the EUV source vessel 110 and a scanner 200 including optical elements configured to direct the EUV radiation 116 to a workpiece (e.g., a semiconductor substrate). In some embodiments, the intermediate focus unit 130 may include a cone shaped aperture configured to provide for separation of pressures between the EUV source vessel 110 and the scanner 200. In some embodiments, the intermediate focus unit 130 may extend into the scanner 200.

The EUV lithography system 10 may also include an EUV energy monitor 150 disposed in the EUV source vessel 110. The EUV energy monitor 150 is designed to monitor the EUV intensity or energy generated from the EUV source vessel 110. For example, the EUV energy monitor 150 includes an EUV sensing element, such as a diode, designed to be sensitive to the EUV light and configured to effectively detect the EUV light. In other examples, the EUV energy monitor 150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. Generally, the dose error is related to the plasma instability, through monitoring the EUV intensity by the EUV energy monitor 150, the dose error can be extracted from the monitored EUV intensity. Therefore, when a dose error is occurred, it indicates that the plasma 114 is unstable.

In some embodiments, the EUV lithography system further includes a droplet collection element 125 disposed in the EUV source vessel 110 and located opposite to the droplet generator 120. The droplet collection element 125 is configured to collect fuel droplets 112 that are not vaporized during formation of the EUV radiation 116 and/or fragments of fuel droplets 112 generated during formation of the EUV radiation 116.

The EUV radiation 116 output from the EUV source vessel 110 is provided to a condenser 210 by way of the intermediate focus unit 130. In some embodiments, the condenser 210 includes first and second surfaces 212a and 212b configured to focus the EUV radiation 116, and a reflector 214 configured to reflect the EUV radiation 116 towards an EUV photomask 220. The EUV photomask 220 is configured to reflect the EUV radiation 116 to form a pattern on a surface of a semiconductor wafer 250. To produce the pattern, the EUV photomask 220 may include a plurality of absorptive features 222a, 222b, and 222c arranged on a front surface of the EUV photomask 220. The plurality of absorptive features 222a, 222b, and 222c are configured to absorb the EUV radiation 116, such that the reflected rays of EUV radiation 116 conveys a patterned defined by the EUV photomask 220.

The EUV radiation 116 is filtered through reduction optics including a series of first to fourth mirrors 230a, 230b, 230c, and 230d, which serve as lenses to reduce a size of the pattern carried by the EUV radiation 116. In some embodiments, the fourth mirror 230d is the last mirror that directly reflects the EUV radiation 116 from previous mirrors onto a on a layer of photoresist coated on a surface of the semiconductor wafer 250. The EUV radiation 116 irradiates particular regions of the layer of photoresist based on the pattern carried by the EUV radiation 116, and thus the layer of irradiated photoresist layer can be patterned after developing it. Therefore, subsequent processing can be performed on selected regions of the semiconductor wafer 250.

Figure 2:
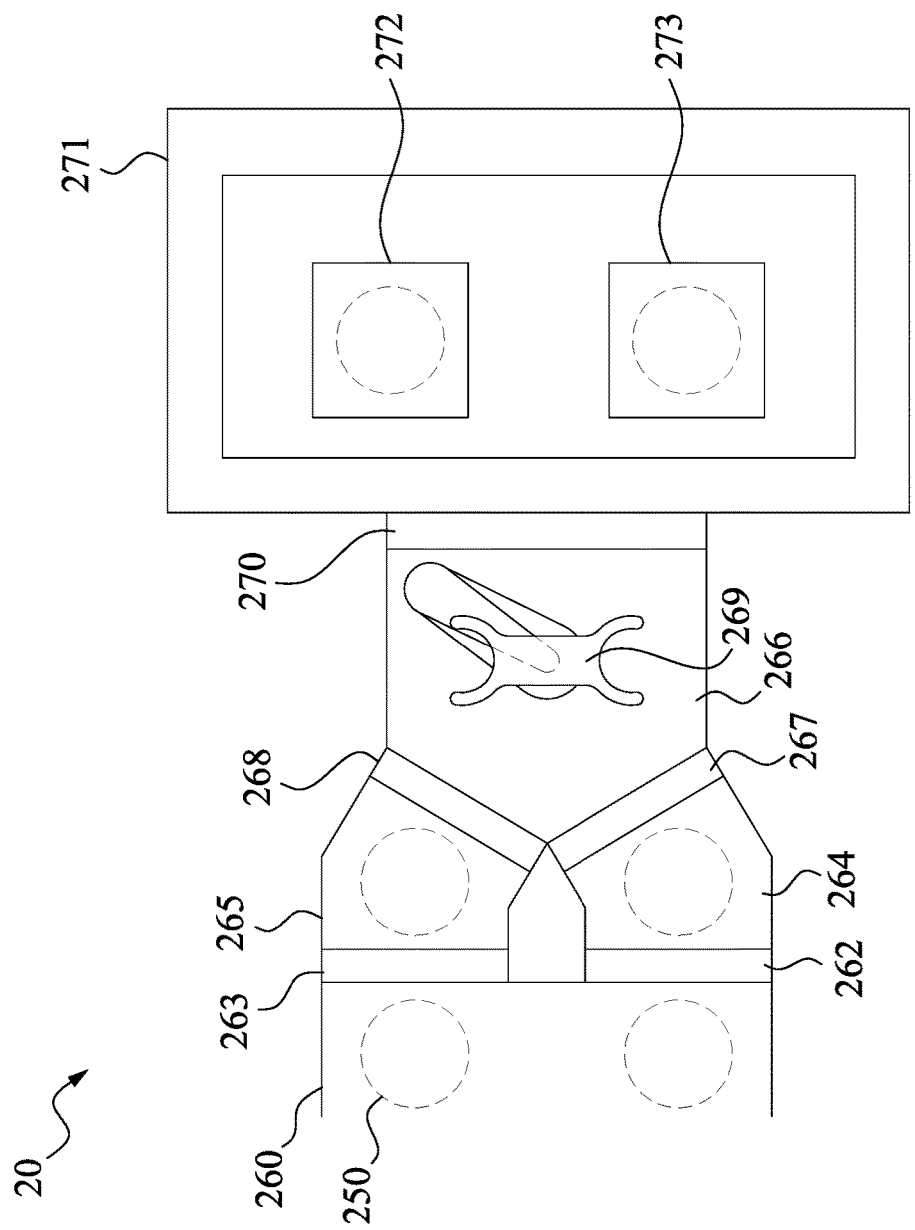
FIG. 2 is a schematic view of a lithography system in accordance with some embodiments of the present disclosure.

FIG. 2 is a schematic view of a lithography system 20 according to the present disclosure. The lithography system 20 may be applied to pattern semiconductor wafers, as discussed above with respect to the semiconductor wafer 250 of FIG. 1. Here, the wafers 250 are indicated by dashed circles. Generally, the wafers are moved from a wafer handler 260, through load locks 264, 265 and a wafer exchange chamber 266, to a lithography chamber 271. It is understood that the lithography process discussed in FIG. 1 is performed when the wafer 250 is positioned in the lithography chamber 271. In some embodiments, prior to performing the lithography process, the wafers 250 in the wafer handler 260 may have been undergone several processes, such as resist-apply, pre-bake, and other processes . . . etc. After the lithography process, wafers are returned to the wafer handler 260 for further processing steps, such as development, post bake, and the like.

The wafer handler 260 is separated from the load locks 264, 264 by gate valve assemblies 262, 263. The load locks 264, 265 are separated from the wafer exchange chamber 266 by gate valve assemblies 267, 268. Accordingly, the load locks 264, 265 can also be referred to as chambers that are separated from the wafer handler 260 and the wafer exchange chamber 266 by respective gate valve assemblies 267, 268. In some embodiments, the load locks 264, 265 may further be connected to vacuum and venting elements (not shown) that allow the load locks 264, 265 to be transitioned from atmospheric pressure to vacuum (pumped-down) and back to atmospheric pressure again (vented). In this way, the wafer exchange chamber 266 can be held at a high vacuum while wafer handler 260 is held at atmospheric pressure. The load locks 264, 265 thus serve to move wafers in and out from the wafer exchange chamber 266 while transitioning from atmospheric pressure to high vacuum.

In some embodiments, the wafer exchange chamber 266 may include a robot arm 269. The robot arm 269 is used to transfer wafers from the load locks 264, 265 to the lithography chamber 271. In some embodiments, the robot arm 269 may include a single end-effector, or dual, non-robotic, transport mechanisms could also be used without departing from the scope of the present disclosure.

The wafer exchange chamber 266 is connected to lithography chamber 271 through a gate valve assembly 270. In some embodiments, the lithography chamber 271 includes wafer stages 272, 273. The wafer stages 272, 273 are capable of movement in the directions indicated for fine alignment and exposure processes. The lithography chamber 271 thus further includes projection optics or other elements necessary to perform the lithography patterning. While lithography chamber 271 is illustrated to have two wafer stages 272, 273, less or more wafer stages may also be employed.

Figure 3A:
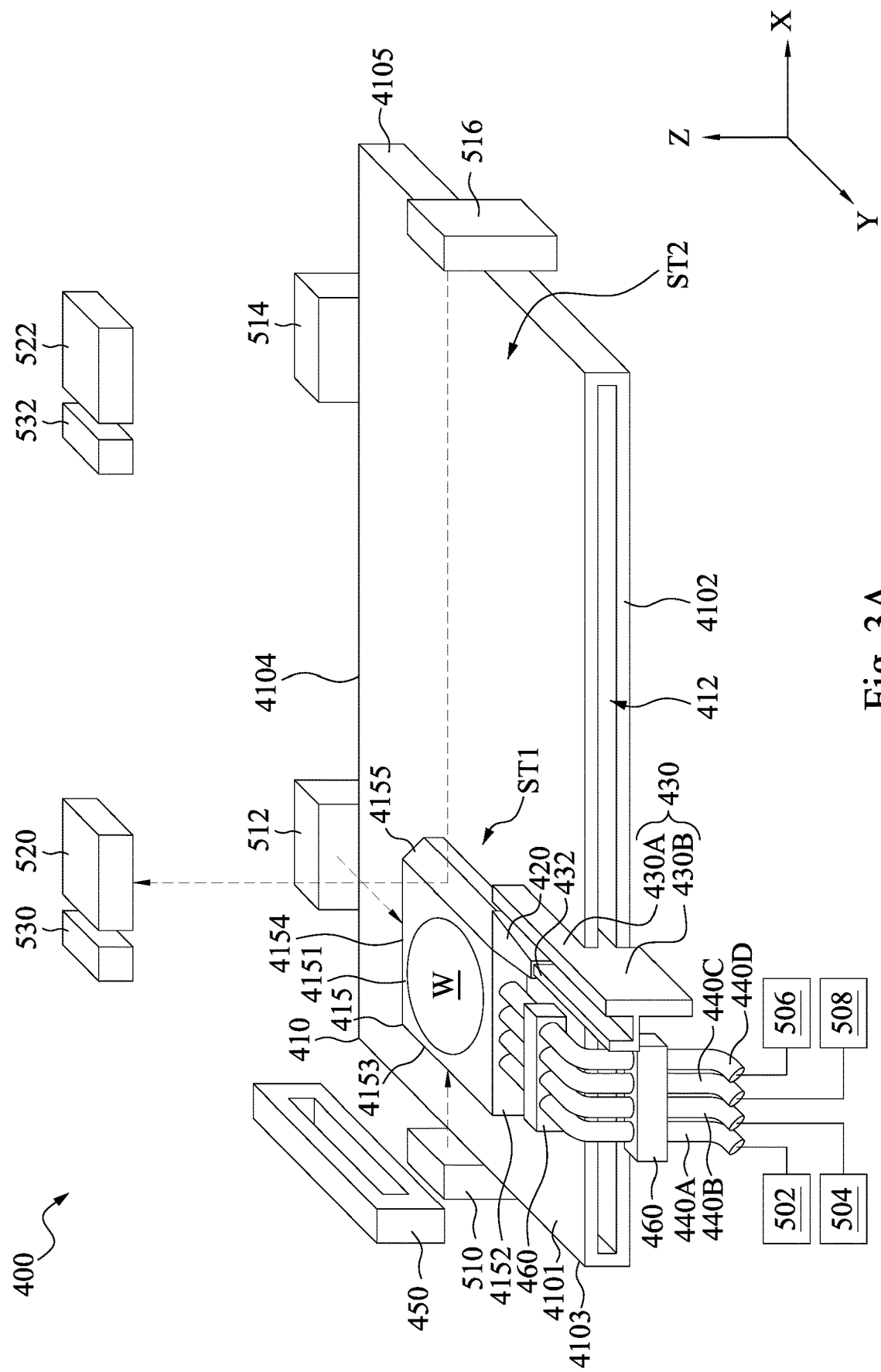
FIGS. 3A and 3B are a schematic view of a wafer table of a lithography chamber in accordance with some embodiments of the present disclosure.
Figure 3B:
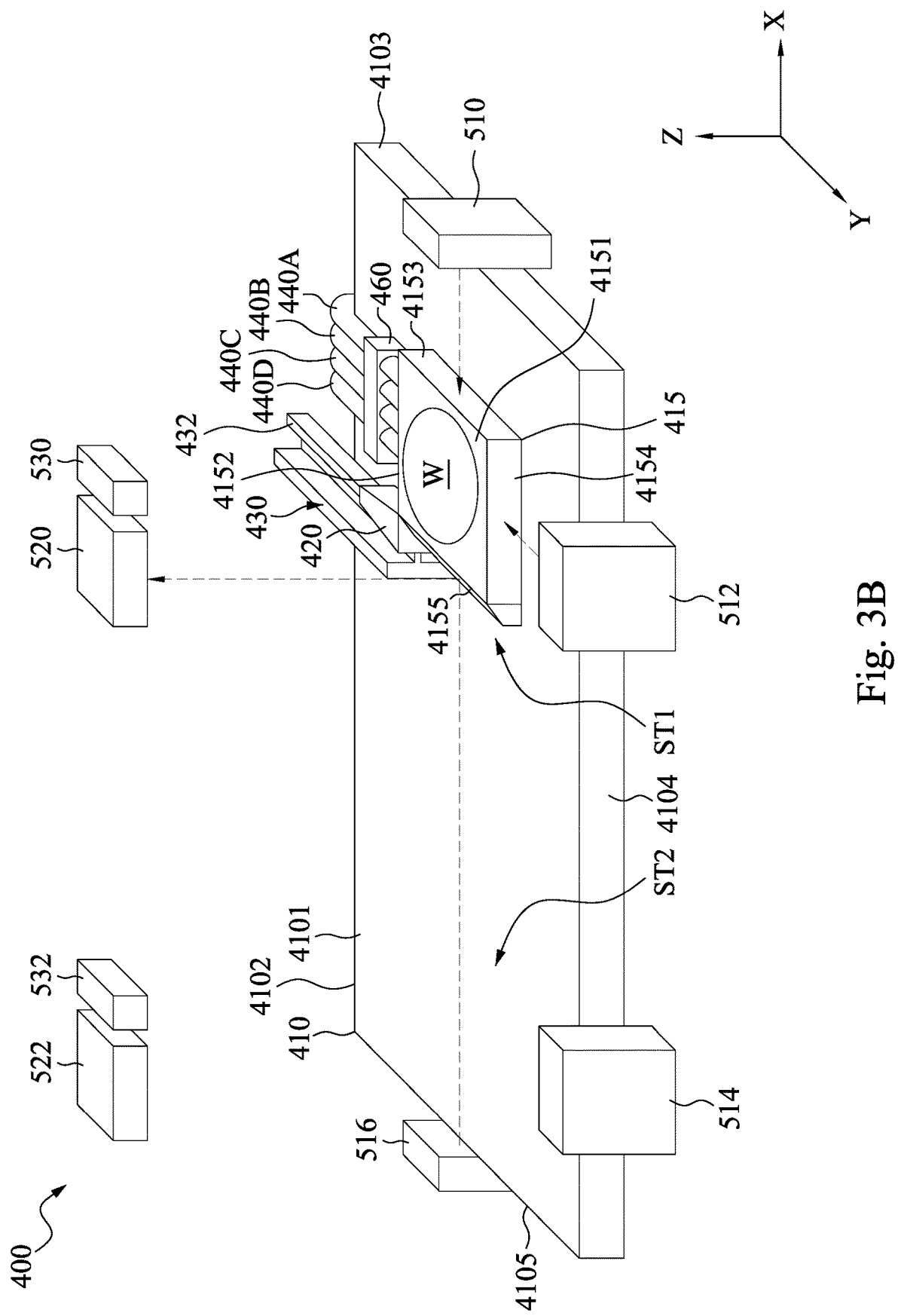

FIGS. 3A and 3B illustrate different views of a wafer table of a lithography chamber in accordance with some embodiments of the present disclosure. It is noted that the lithography chamber 400 discussed in FIGS. 3A and 3B is similar to the lithography chamber 271 discussed in FIG. 2.

The lithography chamber 400 includes a table body 410 (e.g., stage frame). The table body 410 includes a top surface 4101, a sidewall 4102, a sidewall 4103, a sidewall 4104, and a sidewall 4105. The sidewall 4102 is connected to the sidewalls 4103 and 4105, and is opposite to the sidewall 4104. The sidewall 4103 is connected to the sidewalls 4102 and 4104, and is opposite to the sidewall 4105. The sidewall 4104 is connected to the sidewalls 4103 and 4105, and is opposite to the sidewall 4102. The sidewall 4105 is connected to the sidewalls 4102 and 4104, and is opposite to the sidewall 4103.

At least one wafer stage 415 is movably disposed on the table body 410, in which the table body 410 may include a flat, level top surface 4101 over which the wafer stage 415 can move. A wafer W may be disposed on a top surface 4151 of the wafer stage 415. It is noted that, the wafer stage 415 here can be similar to the wafer stages 272, 273 discussed in FIG. 2. In some embodiments, the wafer stage 415 may be coupled to the table body 410 in a non-contact manner. For example, the table body 410 may include a magnet array (stator) of a planar motor while the coil units are built inside the wafer stage 415, so that the wafer stage 415 can be suspended above the table body by using magnetic levitation. In greater detail, the wafer stage 415 can be suspended above the table body 410 with no support other than magnetic field generated from the table body 410, and the magnetic force can be used to counteract the effects of gravitational acceleration. In this way, the wafer stage 415 can be horizontally moved above the table body 410 without contacting the table body 410. In some embodiments, the wafer stage 415 is supported by magnetic levitation above the table body 410 in a non-contact manner by a predetermined clearance, such as around several μm, by adjusting the balance of the upward force (repulsion) such as the electromagnetic force and the downward force (gravitation) including the self-weight, and is also finely driven at least in directions of two degrees of freedom, which are the X-axis direction and the Y-axis direction by using a driving mechanism. In some embodiments, the electromagnetic force can be controlled to raise or lower the wafer stage 415, so that the wafer stage 415 have an additional degree of freedom on the Z-axis direction as well.

The wafer stage 415 includes a top surface 4151, a sidewall 4152, a sidewall 4153, a sidewall 4154, and a sidewall 4155. The sidewall 4152 is connected to the sidewalls 4153 and 4155, and is opposite to the sidewall 4154. The sidewall 4153 is connected to the sidewalls 4152 and 4154, and is opposite to the sidewall 4155. The sidewall 4154 is connected to the sidewalls 4153 and 4155, and is opposite to the sidewall 4152. The sidewall 4155 is connected to the sidewalls 4152 and 4154, and is opposite to the sidewall 4153. In some embodiments, the sidewalls 4152, 4153, and 4154 of the wafer stage 415 are substantially vertical to the top surface 4101 of the table body 410. On the other hand, the sidewall 4155 is an inclined surface, which is tilted about 45° relative to the top surface 4101 of the table body 410. Stated another way, the sidewall 4155 forms an angle about 45° with the top surface 4101 of the table body 410.

In some embodiments, the wafer stage 415 is horizontally movable between a first station ST1 and a second station ST2 of the table body 410. The horizontal motion can be controlled by a motor coupled to the wafer stage 415, and a range of horizontal motion is sufficient to transfer the wafer stage 415 from the first station ST1 to the second station ST2, and also sufficient to transfer the wafer stage 415 from the second station ST2 to the first station ST1. The lithography chamber 400 includes an alignment sensor 530 above the wafer stage 415. In some embodiments, when the wafer stage 415 is at the first station ST1, the alignment sensor 530 can measure alignment marks provided on the wafer W disposed on the wafer stage 415, such that the exact position of the wafer W can be measured, and therefore the wafer W can be properly aligned with a patterning device. When the wafer stage 415 is moved to the second station ST2 (e.g., see FIG. 6C), an exposure process can be performed to the wafer W disposed on the wafer stage 415 through a projection system 532 above the wafer stage 415. In some embodiments, the projection system 532 may include, for example, the condenser 210 of FIG. 1, the photomask 220 of FIG. 1, and the mirrors 230a to 230d of FIG. 1, which are used to convey a radiation onto a layer of photoresist coated on the wafer W. For example, when the wafer stage 415 is at the second station ST2 (e.g., see FIG. 6C), an exposure process can be performed to a layer of photoresist coated on the wafer W, so as to pattern the layer of photoresist. Because the first station ST1 is serve to perform the alignment process and the second station ST2 is serve to perform the exposure process, the first station ST1 can be referred to as an alignment station, and the second station ST2 can be referred to as an exposure station.

The lithography chamber 400 also includes a first sliding member 420 and a second sliding member 430, which are used to move the wafer stage 415 over the top surface 4101 of the table body 410. In some embodiments, the second sliding member 430 has a first portion 430A extending along the top surface 4101 of the table body 410, and a second portion 430B on the sidewall 4102 of the table body 410. In some embodiments, the second portion 430B of the second sliding member 430 is coupled to a slot 412 on the sidewall 4102 of the table body 410, such that the second sliding member 430 can be movable along the slot 412 at the sidewall 4102 of the table body 410 in a first direction (e.g., the X direction).

The second sliding member 430 further includes a track 432 coupled to the first portion 430A. The track 432 extends along the top surface 4101 of the table body 410 and extends in a second direction (e.g., the Y direction). In some embodiments, the first sliding member 420 is movably mounted on the track 432 of the second sliding member 430, such that the first sliding member 420 can be movable along the track 432 of the second sliding member 430 in a second direction (e.g., the Y direction).

The first sliding member 420 is further coupled to the wafer stage 415. As a result, the wafer stage 415 is also coupled to the second sliding member 430 through the first sliding member 420. Accordingly, with such configuration, the wafer stage 415 is movable over the top surface 4101 of the table body 410 along a plane (e.g., X-Y plane) constructed by the first direction (e.g., the X direction) and the second direction (e.g., the Y direction). For example, the wafer stage 415 can move along the first direction (e.g., the X direction) when the second sliding member 430 is actuated to move along the slot 412 on the sidewall 4102 of the table body 410, and can move along the second direction (e.g., the Y direction) when the first sliding member 420 is actuated to move along the track 432 of the second sliding member 430.

The lithography chamber 400 further includes a plurality of cables 440A, 440B, 440C, and 440D with utilities. The cables 440A, 440B, 440C, and 440D are connected to the sidewall 4152 of the wafer stage 415. In some embodiments, the cable 440A is connected to a gas source 502, the cable 440B is connected to a gas source 504, the cable 440C is connected to a liquid source, and the cable 440D is connected to a power source 508. In some embodiments, the gas source 502 may be a hydrogen ($H_2$) source, which provides hydrogen ($H_2$) gas into the wafer stage 415. In some embodiments, the gas source 504 may be an extreme clean dry air (XCDA) source, which provides extreme clean dry air into the wafer stage 415. In some embodiments, the liquid source 506 may be a water ($H_2O$) source, which provides water into the wafer stage 415. In some embodiments, the power source 508 may be a power supplier, which provides electrical power to the wafer stage 415.

Brackets 460 are configured to fix the cables 440A to 440D together, such that the cables 440A to 440D may be arranged neatly and in a desired order. Furthermore, the cable 440A to 440D may be movable along with each other.

Gate valve assembly 450 is disposed close to the sidewall 4103 of the table body 410. The gate valve assembly 450 may be similar to the gate valve assembly 270 described in FIG. 2. In some embodiments, a robot arm (e.g., the robot arm 269 of FIG. 2) may transfer a wafer into the lithography chamber 400 through the gate valve assembly 450, and then place the wafer, such as the wafer W, on the wafer stage 415. It is noted that the gate valve assembly 450 is not illustrated in FIG. 3A for clarity.

The lithography chamber 400 also includes a plurality of stage positioning modules 510, 512, 514, and 516. In some embodiments, the stage positioning module 510 is disposed at the side of the sidewall 4103 of the table body 410. The stage positioning modules 512 and 514 are disposed at the side of the sidewall 4104 of the table body 410, and are spaced apart from each other along the first direction (e.g., X direction). The stage positioning module 516 is disposed at the side of the sidewall 4105 of the table body 410.

In some embodiments, the stage positioning module 510 may include a laser emitter aimed at the sidewall 4153 of the wafer stage 415, and a sensor adjacent to the laser emitter. For example, the laser emitter of the stage positioning module 510 can emit a laser beam to the sidewall 4153 of the wafer stage 415. The sidewall 4153 can reflect the laser beam back to the stage positioning module 510, such that the sensor adjacent to the laser emitter can measure the position of the wafer stage 415 along the first direction (e.g., X direction).

In some embodiments, the stage positioning module 512 may include a laser emitter and a sensor adjacent to the laser emitter. When the wafer stage 415 is at the first station ST1, the laser emitter can be aimed at the sidewall 4154 of the wafer stage 415. For example, the laser emitter of the stage positioning module 512 can emit a laser beam to the sidewall 4154 of the wafer stage 415. The sidewall 4154 can reflect the laser beam back to the sensor adjacent to the laser emitter, such that the stage positioning module 512 can measure the position of the wafer stage 415 along the second direction (e.g., Y direction) when the wafer stage 415 is at the first station ST1.

In some embodiments, the stage positioning module 514 may include a laser emitter and a sensor adjacent to the laser emitter. When the wafer stage 415 is at the second station ST2, the laser emitter can be aimed at the sidewall 4154 of the wafer stage 415. Similarly, the laser emitter of the stage positioning module 514 can emit a laser beam to the sidewall 4154 of the wafer stage 415. The sidewall 4154 can reflect the laser beam back to the sensor adjacent to the laser emitter, such that the stage positioning module 514 can measure the position of the wafer stage 415 along the second direction (e.g., Y direction) when the wafer stage 415 is at the second station ST2.

The lithography chamber 400 also includes a plurality of sensors 520 and 522 disposed over the table body 410. In some embodiments, when the wafer stage 415 is at the first station ST1, the sensor 520 is optically coupled to the stage positioning module 516. For example, the stage positioning module 516 may include a laser emitter aimed at the sidewall 4155 of the wafer stage 415. The laser emitter of the stage positioning module 516 can emit a laser beam to the sidewall 4155 of the wafer stage 415. Because the sidewall 4155 of the wafer stage 415 is tilted about 45° relative to the top surface 4101 of the table body 410, the sidewall 4155 of the wafer stage 415 can reflect the laser beam upwardly to the sensor 520, such that the sensor 520 and the stage positioning module 516 can collectively measure the position of the wafer stage 415 along a third direction (e.g., Z direction) when the wafer stage 415 is at the first station ST1.

When the wafer stage 415 is at the second station ST2, the sensor 522 is optically coupled to the stage positioning module 516. Similarly, the laser emitter of the stage positioning module 514 can emit a laser beam to the sidewall 4155 of the wafer stage 415, and the sidewall 4155 of the wafer stage 415 can reflect the laser beam upwardly to the sensor 522, such that the sensor 522 and the stage positioning module 516 can collectively measure the position of the wafer stage 415 along the third direction (e.g., Z direction) when the wafer stage 415 is at the second station ST2.

FIG. 4A is a schematic view of a wafer stage of a lithography chamber in accordance with some embodiments of the present disclosure. FIG. 4B to FIG. 4D are partial views of the wafer stage of FIG. 4A in accordance with some embodiments of the present disclosure. FIG. 4A illustrates a detailed configuration of the wafer stage 415 discussed in FIGS. 3A and 3B, in which the perspective view of the wafer stage 415 in FIG. 4A is the same as the perspective view of the wafer stage 415 in FIG. 3B.

In some embodiments, the sidewall 4153 of the wafer stage 415 includes a beam splitter 603, the sidewall 4154 of the wafer stage 415 includes a beam splitter 604, and the sidewall 4155 of the wafer stage 415 includes a beam splitter 605. However, the sidewall 4152 of the wafer stage 415 does not include a beam splitter. As mentioned above with respect to FIGS. 3A and 3B, the sidewall 4152 of the wafer stage 415 is connected to the cables 440A to 440D, and thus the sidewall 4152 of the wafer stage 415 may be made of a material different from a material of the beam splitter.

In some embodiments, the outer surfaces of the beam splitters 603 and 604 are substantially vertical to the top surface 4101 of the table body 410 (see FIGS. 3A and 3B). In some embodiments, the surface of the outer surface of the beam splitter 605 is tilted about 45° relative to the top surface 4101 of the table body 410 (see FIGS. 3A and 3B).

The wafer stage 415 includes sensors 613, 614, and 615 disposed inside the body of the wafer stage 415, in which a sensing surface of the sensor 613 faces the beam splitter 603 at the sidewall 4153 of the wafer stage 415, a sensing surface of the sensor 614 faces the beam splitter 604 at the sidewall 4154 of the wafer stage 415, and the sensing surface of the sensor 615 faces the beam splitter 605 at the sidewall 4155 of the wafer stage 415. In some embodiments, the sensing surfaces of the sensors 613, 614, and 615 are vertical to the top surface 4101 of the table body 410 (see FIGS. 3A and 3B). In some embodiments, the sensing surfaces of the sensors 613 and 614 are substantially parallel to the outer surfaces of the beam splitters 603 and 604, respectively, and are parallel to the sidewalls 4153 and 4154 of the wafer stage 415, respectively. On the other hand, the sensing surface of the sensor 615 is tilted about 45° relative to the outer surface of the beam splitter 605 and the sidewall 4155 of the wafer stage 415.

The wafer stage 415 includes a processor 620 electrically coupled to the sensors 613, 614, and 615, and a controller 630 electrically coupled to the processor 620. In some embodiments, the processor 620 can process the signal received from the sensors 613, 614, and 615. In some embodiments, the processor 620 and the controller 630 may include, for example, a central processing unit (CPU), a microprocessor, a programmable logic control unit, a computer or other device or system that is adapted to perform the functions described herein.

Reference is made to FIG. 4B. Shown there is a relative position among the stage positioning module 512 (or 514), the beam splitter 604 at the sidewall 4154 of the wafer stage 415, and the sensor 614. As mentioned above, the stage positioning module 512 (or 514) may be used to measure the position of the wafer stage 415. During measuring the position of the wafer stage 415, the stage positioning module 512 (or 514) may emit a laser beam LB1 toward the wafer stage 415, such that the laser beam LB1 is incident on an incident surface of the beam splitter 604. As a result, the laser beam LB1 is split, by the beam splitter 604, into a laser beam LB11 and a laser beam LB12, in which the laser beam LB11 is the laser beam reflected by the beam splitter 604, while the laser beam LB12 is the laser beam transmitting through the beam splitter 604. In some embodiments, the laser beam LB1 can be referred to as an incident laser beam, the laser beam LB11 can be referred to as a reflected laser beam, and the laser beam LB12 can be referred to as a transmitted laser beam, respectively.

As mentioned above, the stage positioning module 512 (or 514) can measure the position of the wafer stage 415 along the second direction (e.g., Y direction). For example, the stage positioning module 512 (or 514) can emit the laser beam LB1 toward the beam splitter 604 on the wafer stage 415, receive the reflected laser beam LB11 from the beam splitter 604, and therefore calculate the distance between the stage positioning module 512 (or 514) and the beam splitter 604, which determines the position of the wafer stage 415.

Furthermore, the stage positioning module 512 (or 514) is able to send out a control signal to control the wafer stage 415. For example, the stage positioning module 512 (or 514) can emit the laser beam LB1 toward the beam splitter 604 on the wafer stage 415. The laser beam LB1 can be a modulated laser beam, which carries a control signal capable of triggering electrical and/or mechanical operations such as wafer stage movement/gas ejection/liquid ejection. By contrast, a laser beam that does not carry any control signal is called an unmodulated laser beam, such as the laser beam used to measure position of the wafer stage 415 as discussed previously. As a result, the sensor 614 in the wafer stage 415 can receive the transmitted laser beam LB12, and the processor 620 can decode the transmitted laser beam LB12 to obtain the control signal carried by the transmitted laser beam LB12. The sensor 614 is optically coupled to the stage positioning module 512 (or 514) through the beam splitter 604.

The processor 620 further transmits the control signal to the controller 630, and the controller 630 can control the wafer stage 415 in several manners. In some embodiments, the controller 630 may control the wafer stage 415, according to the control signal carried by the laser beam LB1, the position of the wafer stage 415, the delivery of gas from the gas sources 502, 504 (see FIG. 3A), and the delivery of liquid from the liquid source 506 (see FIG. 3A).

For example, when the control signal is a position control signal, the controller 630 can actuate the first sliding member 420 and the second sliding member 430 (see FIGS. 3A and 3B), so as to move the wafer stage 415 to a desired position over the table body 410, such as moving the wafer stage 415 to the first station ST1 or to the second station ST2 (see FIGS. 3A and 3B). During moving the wafer stage 415, the position of the wafer stage 415 can be detected simultaneously by detecting the reflected laser beam LB11.

Moreover, when the control signal is a gas delivery control signal, the controller 630 can control a gas delivery to the wafer stage 415. In some embodiments, the gas source 502 may be a hydrogen ($H_2$) source, and the gas source 504 may be an extreme clean dry air (XCDA) source. For example, the controller 630 may carry out a cleaning process by turning on a valve of the cable 440A connected to the gas source 502 to introduce the gas from the gas source 502 (e.g., $H_2$) into the wafer stage 415, and then ejecting the gas out of the wafer stage 415 to clean the wafer stage 415, such as blowing particle away from top surface 4151 of the wafer stage 415. After the cleaning process, the controller 630 may further carry out a purging process by turning on a valve of the cable 440B connected to the gas source 504 to introduce the gas from the gas source 504 (e.g., XCDA) into the wafer stage 415, and then ejecting the gas out of the wafer stage 415 to purge the gas from the gas source 502 (e.g., $H_2$) away.

Furthermore, when the control signal is a liquid delivery control signal, the controller 630 can control a liquid delivery to the wafer stage 415. In some embodiments, the liquid source 506 may be a water source. For example, the controller 630 may carry out a cooling process by turning on a valve of the cable 440C connected to the liquid source 506 to introduce the liquid from the liquid source 506 (e.g., water) into the wafer stage 415. In some embodiments, the cooling process may be performed after performing an exposure process to a wafer.

Reference is made to FIG. 4C. Shown there is a relative position among the stage positioning module 510, the beam splitter 603 at the sidewall 4153 of the wafer stage 415, and the sensor 613. As mentioned above, the stage positioning module 510 may be used to measure the position of the wafer stage 415. During measuring the position of the wafer stage 415, the stage positioning module 510 may emit a laser beam LB2 toward the wafer stage 415, such that the laser beam LB2 is incident on an incident surface of the beam splitter 603. As a result, the laser beam LB2 is split, by the beam splitter 603, into a laser beam LB21 and a laser beam LB22, in which the laser beam LB21 is the laser beam reflected by the beam splitter 603, while the laser beam LB22 is the laser beam transmitting through the beam splitter 603. In some embodiments, the laser beam LB2 can be referred to as an incident laser beam, the laser beam LB21 can be referred to as a reflected laser beam, and the laser beam LB22 can be referred to as a transmitted laser beam, respectively.

As mentioned above, the stage positioning module 510 can measure the position of the wafer stage 415 along the first direction (e.g., X direction). For example, the stage positioning module 510 can emit the laser beam LB2 toward the beam splitter 603 on the wafer stage 415, receive the reflected laser beam LB21 from the beam splitter 603, and therefore calculate the distance between the stage positioning module 510 and the beam splitter 603, which determines the position of the wafer stage 415.

Furthermore, the stage positioning module 510 is able to send a control signal to control the wafer stage 415. For example, the stage positioning module 510 can emit the laser beam LB2 toward the beam splitter 603 on the wafer stage 415, while the laser beam LB2 can be a modulated laser, which carries a control signal. As a result, the sensor 613 in the wafer stage 415 can receive the transmitted laser beam LB22, the processor 620 can decode the transmitted laser beam LB22 to obtain the control signal carried by the transmitted laser beam LB22. The sensor 613 is optically coupled to the stage positioning module 510 through the beam splitter 603.

The processor 620 further transmits the control signal to the controller 630, and the controller 630 can control the wafer stage 415 in several manners. In some embodiments, the controller 630 may control the wafer stage 415, according to the control signal carried by the laser beam LB2, the position of the wafer stage 415, the delivery of gas from the gas sources 502, 504 (see FIG. 3A), and the delivery of liquid from the liquid source 506 (see FIG. 3A). For example, the control signal may be a position control signal, a gas delivery control signal, and/or a liquid delivery control signal, which are similar to those described with respect to FIG. 4B, and thus relevant details will not be repeated for simplicity.

Reference is made to FIG. 4D. Shown there is a relative position among the stage positioning module 516, the beam splitter 605 at the sidewall 415S of the wafer stage 415, the sensor 520 (522), and the sensor 615. As mentioned above, the stage positioning module 516 may be used to measure the position of the wafer stage 415. During measuring the position of the wafer stage 415, the stage positioning module 516 may emit a laser beam LB3 toward the wafer stage 415, such that the laser beam LB3 is incident on an incident surface of the beam splitter 603. As a result, the laser beam LB3 is split, by the beam splitter 605, into a laser beam LB31 and a laser beam LB32, in which the laser beam LB31 is the laser beam reflected by the beam splitter 605, while the laser beam LB32 is the laser beam transmitting through the beam splitter 605. It is understood that, the laser beam LB31 is reflected by the beam splitter 605, and is directed upwardly to the sensor 520 (522). In some embodiments, the laser beam LB3 can be referred to as an incident laser beam, the laser beam LB31 can be referred to as a reflected laser beam, and the laser beam LB32 can be referred to as a transmitted laser beam, respectively.

As mentioned above, the stage positioning module 516 can measure the position of the wafer stage 415 along the third direction (e.g., Z direction). For example, the stage positioning module 516 can emit the laser beam LB3 toward the beam splitter 605 on the wafer stage 415, the sensor 520 (522) above the wafer stage 415 can receive the reflected laser beam LB31 from the beam splitter 605, and therefore calculate the distance between the sensor 520 (522) and the beam splitter 605, which determines the position of the wafer stage 415. The sensor 520 (522) is optically coupled to the stage positioning module 516 through the beam splitter 605.

Furthermore, the stage positioning module 516 is able to send a control signal to control the wafer stage 415. For example, the stage positioning module 516 can emit the laser beam LB3 toward the beam splitter 605 on the wafer stage 415, while the laser beam LB3 can be a modulated laser, which carries a control signal. As a result, the sensor 615 in the wafer stage 415 can receive the transmitted laser beam LB32, the processor 620 can decode the transmitted laser beam LB32 to obtain the control signal carried by the transmitted laser beam LB32. The sensor 615 is optically coupled to the stage positioning module 516 through the beam splitter 605.

The processor 620 can transmit the control signal to the controller 630, and the controller 630 can control the wafer stage 415 in several manners. In some embodiments, the controller 630 may control the wafer stage 415, according to the control signal carried by the laser beam LB3, the position of the wafer stage 415, the delivery of gas from the gas sources 502, 504 (see FIG. 3A), and the delivery of liquid from the liquid source 506 (see FIG. 3A). For example, the control signal may be a position control signal, a gas delivery control signal, and/or a liquid delivery control signal, which are similar to those described with respect to FIG. 4B, and thus relevant details will not be repeated for simplicity.

In some embodiments of the present disclosure, a wireless control operation is provided to control a wafer stage by emitting a modulated laser beam, which carries a control signal, toward a beam splitter on a wafer stage, the modulated laser beam may transmit through the beam splitter and may be received by a sensor in the wafer stage. Accordingly, processor and controller in the wafer stage are able to control the wafer stage according to the received control signal. With this configuration, a cable for transmitting control signal can be omitted, which will reduce about 30% to about 40% number of the cables (such as cables 440A to 440D in FIGS. 3A and 3B). As a result, less cables will cause less particles (such as dust) falling on the table body, and will further reduce particle defect on the wafer, which in turn will improve die yield.

Figure 5:
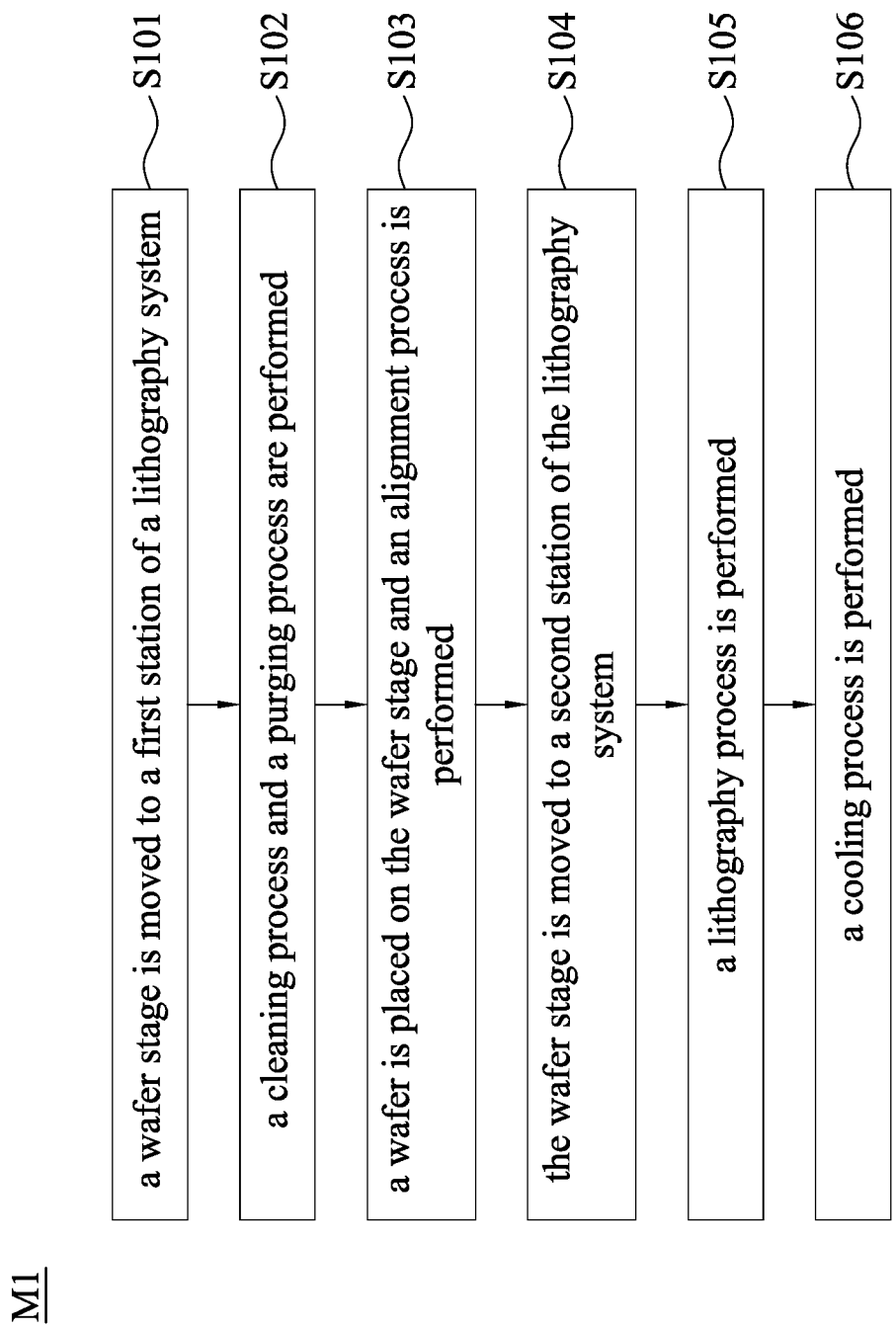
FIG. 5 illustrates a method of operating a lithography system in accordance with some embodiments of the present disclosure.
Figure 6A:
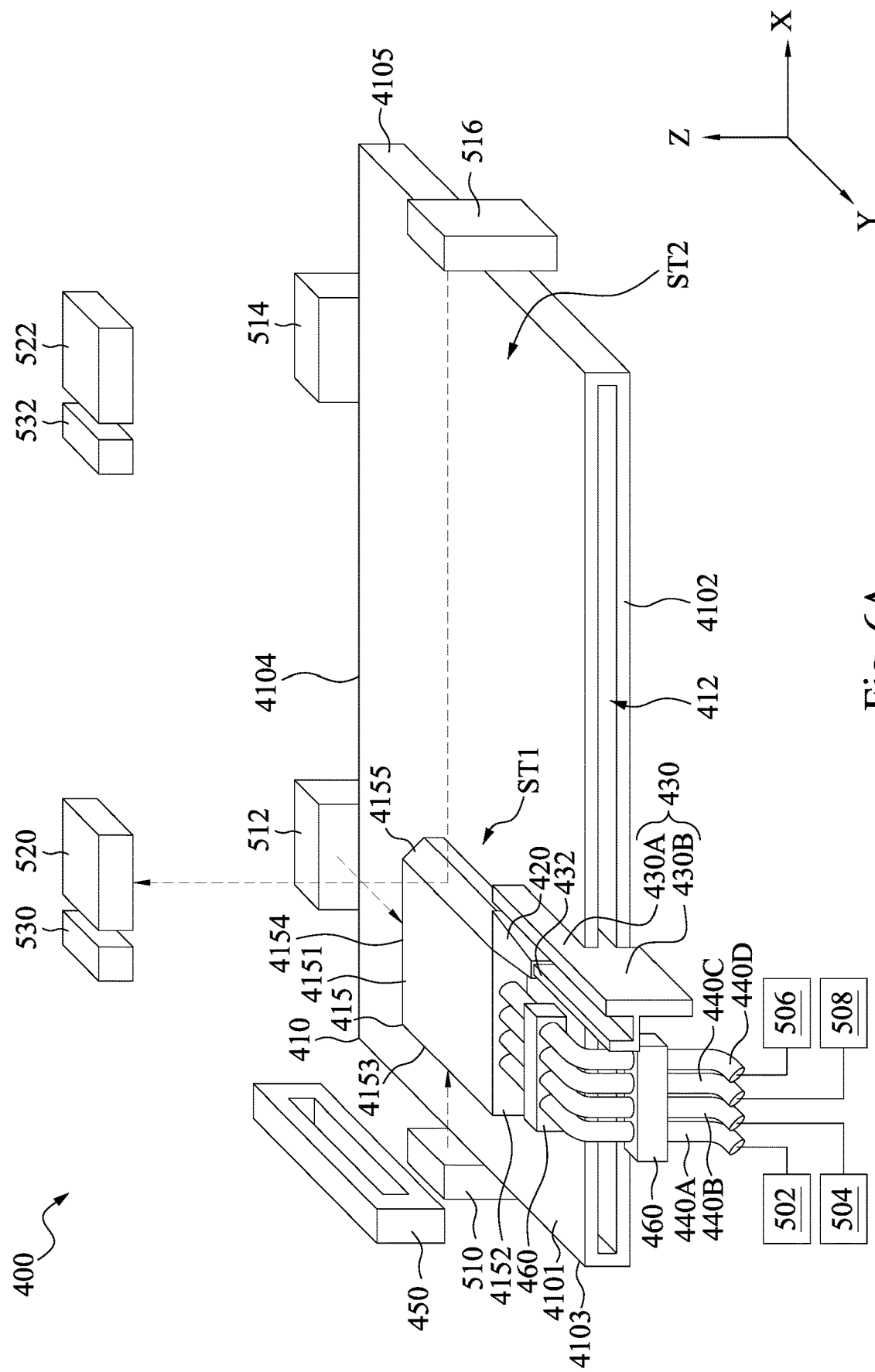
FIGS. 6A to 6C are schematic views of a lithography chamber in various stages of operations in accordance with some embodiments of the present disclosure.
Figure 6B:
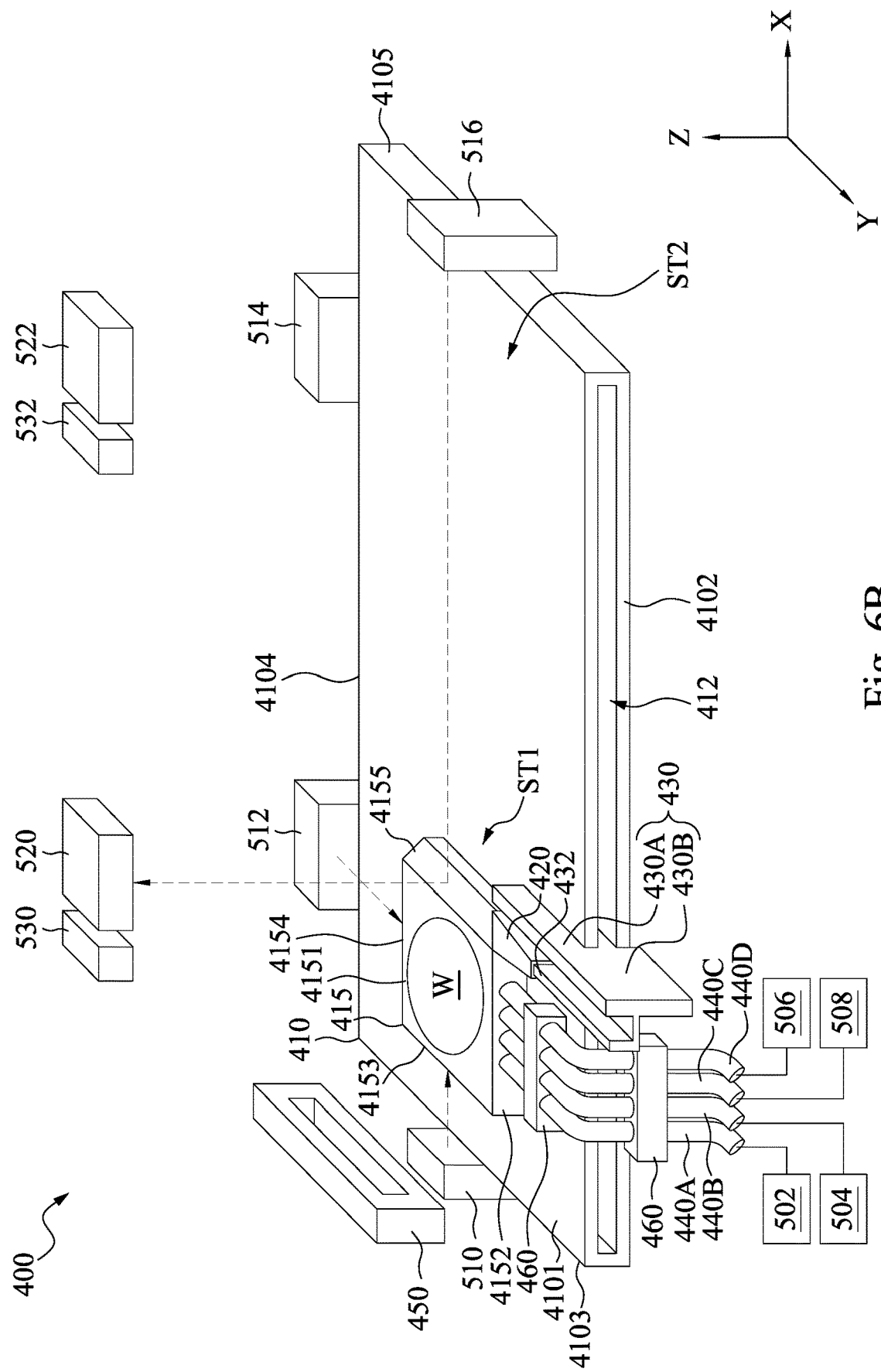
Figure 6C:
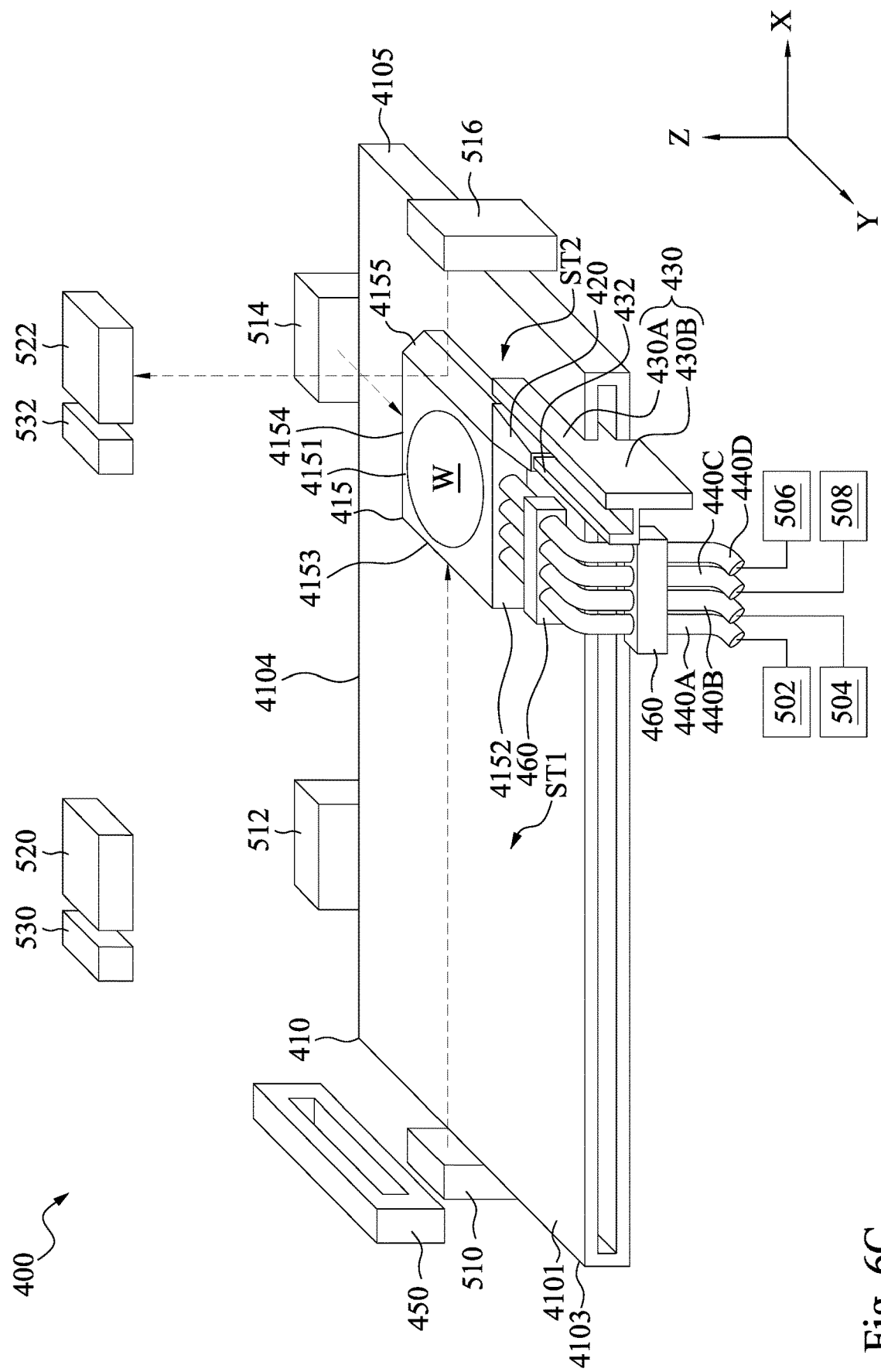

FIG. 5 illustrates a method M1 of operating a lithography system in accordance with some embodiments of the present disclosure. FIGS. 6A to 6C are schematic views of a lithography system in various stages of operations of method M1. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It is noted that some elements of FIGS. 6A to 6C have been described in FIGS. 3A to 3B and 4A to 4D, such elements are labeled the same and relevant details will not be repeated for simplicity.

Reference is made to FIGS. 5 and 6A. The method M1 starts at operation S101, a wafer stage is moved to a first station of a lithography system. As shown in FIG. 6A, the wafer stage 415 is moved to the first station ST1 of the lithography chamber 400, such that the wafer stage 415 is below an alignment sensor 530. In some embodiments, the wafer stage 415 can be moved by, for example, emitted one or more modulated laser beams from the stage positioning modules 510, 512, 514, and/or 516. The modulated laser beams, which carries a position control signal, can be the laser beam LB1 of FIG. 4B, the laser beam LB2 of FIG. 4C, and/or the laser beam LB3 of FIG. 4D. The modulated laser beams may transmit the respective beam splitters on the wafer stages 415 (such as the beam splitters 604, 603, and/or 605 of FIGS. 4A to 4D), and may be received by the respective sensors in the wafer stages 415 (such as the sensors 614, 613, and/or 615 of FIGS. 4A to 4D). The processor in the wafer stages 415 (such as the processor 620 of FIGS. 4A to 4D) may decode the modulated laser beams and transmit the control signal to the controller in the wafer stages 415 (such as the controller 630 of FIGS. 4A to 4D). As a result, the controller can control the first sliding member 420 and the second sliding member 430 to move the wafer stage 415 to the first station ST1.

Reference is still made to FIGS. 5 and 6A. The method M1 proceeds to operation S102, a cleaning process and a purging process are performed. A cleaning process may be performed by ejecting a hydrogen ($H_2$) gas from a top surface 4151 of the wafer stage 415 to blow particles away from the wafer stage 415, and a purging process may be performed by ejecting an extreme clean dry air (XCDA) to purge the hydrogen ($H_2$) gas of the cleaning process.

In some embodiments, the cleaning process can be done by, for example, emitted one or more modulated laser beams from the stage positioning modules 510, 512, 514, and/or 516. The modulated laser beams, which carries a gas delivery control signal, can be the laser beam LB1 of FIG. 4B, the laser beam LB2 of FIG. 4C, and/or the laser beam LB3 of FIG. 4D. The modulated laser beams may transmit the respective beam splitters on the wafer stages 415 (such as the beam splitters 604, 603, and/or 605 of FIGS. 4A to 4D), and may be received by the respective sensors in the wafer stages 415 (such as the sensors 614, 613, and/or 615 of FIGS. 4A to 4D). The processor in the wafer stages 415 (such as the processor 620 of FIGS. 4A to 4D) may decode the modulated laser beams and transmit the control signal to the controller in the wafer stages 415 (such as the controller 630 of FIGS. 4A to 4D). As a result, the controller can turn on a valve of the cable 440A connected to the gas source 502 to introduce the gas from the gas source 502 (e.g., $H_2$) into the wafer stage 415, and then ejecting the gas out of the wafer stage 415 to clean the wafer stage 415, such as blowing particle away from top surface 4151 of the wafer stage 415.

The purging process can be done by, for example, emitted one or more modulated laser beams from the stage positioning modules 510, 512, 514, and/or 516. The modulated laser beams, which carries a gas delivery control signal, can be the laser beam LB1 of FIG. 4B, the laser beam LB2 of FIG. 4C, and/or the laser beam LB3 of FIG. 4D. The modulated laser beams may transmit the respective beam splitters on the wafer stages 415 (such as the beam splitters 604, 603, and/or 605 of FIGS. 4A to 4D), and may be received by the respective sensors in the wafer stages 415 (such as the sensors 614, 613, and/or 615 of FIGS. 4A to 4D). The processor in the wafer stages 415 (such as the processor 620 of FIGS. 4A to 4D) may decode the modulated laser beams to transmit the control signal to the controller in the wafer stages 415 (such as the controller 630 of FIGS. 4A to 4D). As a result, the controller can turn on a valve of the cable 440B connected to the gas source 504 to introduce the gas from the gas source 504 (e.g., XCDA) into the wafer stage 415, and then ejecting the gas out of the wafer stage 415 to purge the gas from the gas source 502 (e.g., $H_2$) away.

Reference is made to FIGS. 5 and 6B. The method M1 proceeds to operation S103, a wafer is placed on the wafer stage and an alignment process is performed. In FIG. 6B, a wafer W is placed on the top surface 4151 of the wafer stage 415. For example, a robot arm (e.g., the robot arm 269 in FIG. 2) may transfer the wafer W into the lithography chamber 400 through the gate valve assembly 450, and then place the wafer W over the wafer stage 415.

The alignment process may include measuring alignment marks provided on the wafer W, detecting an exact position of the wafer stage 415, and measuring an exact location of the alignment marks on the wafer W. For example, an alignment sensor 530 at the first station ST1 can measure alignment marks provided on the wafer W. Furthermore, an exact position of the wafer stage 415 is detected by the stage positioning modules 510, 512, and 516, and the sensors 520. By comparing the exact position of the wafer stage 415 and the measurement performed by the alignment sensor 530, the exact location of the alignment mark on the wafer W can be measured.

In some embodiments, the exact position of the wafer stage 415 may be detected by the method as described with respect to FIGS. 4A to 4D. For example, laser beams may be emitted from the stage positioning modules 510, 512, and 516. The laser beams may be reflected by the respective beam splitters on the wafer stages 415 (such as the beam splitters 604, 603, and/or 605 of FIGS. 4A to 4D), and the reflected laser beams may be received by the respective sensors, such as the sensors in the stage positioning modules 510, 512, or the sensor 520 over the wafer stage 415. Accordingly, the position of the wafer stage 415 may be detected.

Reference is made to FIGS. 5 and 6C. The method M1 proceeds to operation S104, the wafer stage is moved to a second station of the lithography system. As shown in FIG. 6C, the wafer stage 415 is moved to the second station ST2 of the lithography chamber 400, such that the wafer stage 415 is below the projection system 532. In some embodiments, the wafer stage 415 can be moved by, for example, emitted one or more modulated laser beams from the stage positioning modules 510, 512, 514, and/or 516. The modulated laser beams, which carries a position control signal, can be the laser beam LB1 of FIG. 4B, the laser beam LB2 of FIG. 4C, and/or the laser beam LB3 of FIG. 4D. The modulated laser beams may transmit the respective beam splitters on the wafer stages 415 (such as the beam splitters 604, 603, and/or 605 of FIGS. 4A to 4D), and may be received by the respective sensors in the wafer stages 415 (such as the sensors 614, 613, and/or 615 of FIGS. 4A to 4D). The processor in the wafer stages 415 (such as the processor 620 of FIGS. 4A to 4D) may decode the modulated laser beams and transmit the control signal to the controller in the wafer stages 415 (such as the controller 630 of FIGS. 4A to 4D). As a result, the controller can control the first sliding member 420 and the second sliding member 430 to move the wafer stage 415 and the wafer W to the second station ST2.

Reference is still made to FIGS. 5 and 6C. The method M1 proceeds to operation S105, a lithography process is performed. In greater details, an exposure process may be performed, by the projection system 532, to a layer of photoresist disposed on the wafer W, so as to pattern the layer of photoresist on the wafer W.

Reference is still made to FIGS. 5 and 6C. The method M1 proceeds to operation S105, a cooling process is performed. In greater details, a cooling process may be performed to the wafer stage after the lithography process. In some embodiments, the cooling process can be done by, for example, emitted one or more modulated laser beams from the stage positioning modules 510, 514, and/or 516. The modulated laser beams, which carries a liquid delivery control signal, can be the laser beam LB1 of FIG. 4B, the laser beam LB2 of FIG. 4C, and/or the laser beam LB3 of FIG. 4D. The modulated laser beams may transmit the respective beam splitters on the wafer stages 415 (such as the beam splitters 604, 603, and/or 605 of FIGS. 4A to 4D), and may be received by the respective sensors in the wafer stages 415 (such as the sensors 614, 613, and/or 615 of FIGS. 4A to 4D). The processor in the wafer stages 415 (such as the processor 620 of FIGS. 4A to 4D) may decode the modulated laser beams and transmit the control signal to the controller in the wafer stages 415 (such as the controller 630 of FIGS. 4A to 4D). As a result, the controller can turn on a valve of the cable 440C connected to the liquid source 506 to introduce the liquid from the liquid source 506 (e.g., water) into the wafer stage 415, so as to cool down the wafer stages 415.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that, a wireless control method is provided to control a wafer stage by emitting a modulated laser beam, which carries a control signal, toward a beam splitter on a wafer stage, the modulated laser beam may transmit through the beam splitter and may be received by a sensor in the wafer stage. Accordingly, processor and controller in the wafer stage are able to control the wafer stage according to the received control signal. With this configuration, a cable for transmitting control signal can be omitted, which will reduce about 30% to about 40% number of the cables. As a result, less cables will cause less particles (such as dust) falling on the table body, and will further reduce particle defect on the wafer, which in turn will improve die yield.

In some embodiments of the present disclosure, a method includes moving a wafer stage to a first station on a table body of a lithography chamber; placing a wafer on a top surface of the wafer stage; emitting a first laser beam from a first laser emitter toward a first beam splitter on a first sidewall of the wafer stage, wherein a first portion of the first laser beam is reflected by the first beam splitter to form a first reflected laser beam, and a second portion of the first laser beam transmits through the first beam splitter to form a first transmitted laser beam; calculating a position of the wafer stage on a first axis based on the first reflected laser beam; after calculating the position of the wafer, moving the wafer stage to a second station on the table body; and performing a lithography process to the wafer when the wafer stage is at the second station.

In some embodiments, calculating the position of the wafer stage on the first axis comprises receiving the first reflected laser beam by a sensor adjacent to the first laser emitter.

In some embodiments, the method further includes emitting a second laser beam from a second laser emitter toward a second beam splitter on a second sidewall of the wafer stage, in which a first portion of the second laser beam is reflected by the second beam splitter to form a second reflected laser beam, and a second portion of the second laser beam transmits through the second beam splitter to form a second transmitted laser beam, and in which an incident surface of the second beam splitter is tiled about 45° relative to a top surface of the table body; and based on the second reflected laser beam, calculating the position of the wafer stage on a second axis perpendicular to the first axis.

In some embodiments, an incident surface of the first beam splitter is substantially vertical to the top surface of the table body.

In some embodiments, calculating the position of the wafer stage on the second axis comprises receiving the second reflected laser beam by a sensor disposed above the wafer stage.

In some embodiments, moving the wafer stage to the second station on the table body includes: when the wafer stage is at the first station, emitting a modulated laser beam, which carries a position control signal, from the first laser emitter toward the first beam splitter on the first sidewall of the wafer stage; receiving the modulated laser beam transmitting through the first beam splitter by a sensor in the wafer stage; and based on the position control signal carried by the received modulated laser beam, moving the wafer stage.

In some embodiments, the method further includes emitting a modulated laser beam, which carries a gas delivery control signal, from the first laser emitter toward the first beam splitter on the first sidewall of the wafer stage; receiving the modulated laser beam transmitting through the first beam splitter by a sensor in the wafer stage; and based on the gas delivery control signal carried by the received modulated laser beam, ejecting a gas out of the wafer stage.

In some embodiments, the method further includes emitting a modulated laser beam, which carries a liquid delivery control signal, from the first laser emitter toward the first beam splitter on the first sidewall of the wafer stage; receiving the modulated laser beam transmitting through the first beam splitter by a sensor in the wafer stage; and based on the liquid delivery control signal carried by the received modulated laser beam, introducing a liquid into the wafer stage.

In some embodiments of the present disclosure, a method includes moving a wafer stage to a first station on a table body of a lithography chamber; placing a wafer on a top surface of the wafer stage; emitting a first modulated laser beam from a first laser emitter toward a first beam splitter on a first sidewall of the wafer stage; receiving a first portion of the first modulated laser beam transmitting through the first beam splitter by a first sensor in the wafer stage; in response to the received first portion of the first modulated laser beam, moving the wafer stage from the first station to a second station on the table body; and performing a lithography process to the wafer when the wafer stage is at the second station.

In some embodiments, the method further includes emitting a first unmodulated laser beam from the first laser emitter toward the first beam splitter on the first sidewall of the wafer stage; receiving, by the first stage positioning module, a second portion of the first unmodulated laser beam reflected by the first beam splitter; and calculating a position of the wafer stage on a first axis based on the received second portion of the first unmodulated laser beam.

In some embodiments, the method further includes emitting a second unmodulated laser beam from a second laser emitter toward a second beam splitter on a second sidewall of the wafer stage; receiving, by a second sensor above the wafer stage, a portion of the second unmodulated laser beam reflected by the second beam splitter; and calculating the position of the wafer stage on a second axis.

In some embodiments, an incident surface of the first beam splitter is substantially vertical to the top surface of the wafer stage, and an incident surface of the second beam splitter is tilted about 45° relative to the top surface of the wafer stage.

In some embodiments, the method further includes emitting a second modulated laser to the first sensor in the wafer stage through the first beam splitter on the first sidewall of the wafer stage; and in response to the second modulated laser, ejecting a hydrogen gas out of the wafer stage, in which the wafer is placed on the wafer stage after the step of ejecting the hydrogen gas is complete.

In some embodiments, the method further includes emitting a third modulated laser to the first sensor in the wafer stage through the first beam splitter on the first sidewall of the wafer stage; and in response to the third modulated laser, ejecting a dry air out of the wafer stage.

In some embodiments, the method further includes after the lithography process is complete, emitting a fourth modulated laser to the first sensor in the wafer stage through the first beam splitter on the first sidewall of the wafer stage; and in response to the fourth modulated laser, introducing a water into the wafer stage by emitting a fourth modulated laser.

In some embodiments of the present disclosure, a method includes moving a wafer stage to a first station on a table body of a lithography chamber; placing a wafer on a top surface of the wafer stage; determining a position of the wafer stage by a wireless operation that comprises emitting a first laser beam from a first laser emitter to a first sensor inside the wafer stage through a first beam splitter on a first sidewall of the wafer stage; and after determining the position of the wafer stage by the wireless operation, performing a lithography process to the wafer using a projection system above the wafer stage.

In some embodiments, wherein an incident surface of the first beam splitter is substantially vertical to a top surface of the table body.

In some embodiments, wherein an incident surface of the first beam splitter is tilted about 45° relative to a top surface of the table body.

In some embodiments, wherein determining the position of the wafer stage by the wireless operation further comprises emitting a second laser beam from a second laser emitter to a second sensor above the wafer stage through a second beam splitter on a second sidewall of the wafer stage adjacent to the first sidewall of the wafer stage; and emitting a third laser beam from a third laser emitter to a third sensor inside the wafer stage through a third beam splitter on a third sidewall of the wafer stage opposite to the second sidewall of the wafer stage.

In some embodiments, the method further includes, after the lithography process is complete, introducing water into the wafer stage through a cable connected to a fourth sidewall of the wafer stage opposite to the first sidewall of the wafer stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    moving a wafer stage to a first station on a table body of a lithography chamber;
    placing a wafer on a top surface of the wafer stage;
    emitting a first laser beam from a first laser emitter toward a first beam splitter on a first sidewall of the wafer stage, wherein a first portion of the first laser beam is reflected by the first beam splitter to form a first reflected laser beam, and a second portion of the first laser beam transmits through the first beam splitter to form a first transmitted laser beam;
    calculating a position of the wafer stage on a first axis based on the first reflected laser beam;
    after calculating the position of the wafer, moving the wafer stage to a second station on the table body;
    emitting a first modulated laser beam, which carries a gas delivery control signal, from the first laser emitter toward the first beam splitter on the first sidewall of the wafer stage;
    receiving the first modulated laser beam transmitting through the first beam splitter by a first sensor in the wafer stage;
    based on the gas delivery control signal carried by the received first modulated laser beam, ejecting a gas out of the wafer stage; and
    performing a lithography process to the wafer after ejecting the gas.

2. The method of claim 1, wherein calculating the position of the wafer stage on the first axis comprises receiving the first reflected laser beam by a second sensor adjacent to the first laser emitter.

3. The method of claim 1, further comprising:
    emitting a second laser beam from a second laser emitter toward a second beam splitter on a second sidewall of the wafer stage, wherein a first portion of the second laser beam is reflected by the second beam splitter to form a second reflected laser beam, and a second portion of the second laser beam transmits through the second beam splitter to form a second transmitted laser beam, and wherein an incident surface of the second beam splitter is tiled about 45° relative to a top surface of the table body; and
    based on the second reflected laser beam, calculating the position of the wafer stage on a second axis perpendicular to the first axis.

4. The method of claim 3, wherein an incident surface of the first beam splitter is substantially vertical to the top surface of the table body.

5. The method of claim 3, wherein calculating the position of the wafer stage on the second axis comprises receiving the second reflected laser beam by a second sensor disposed above the wafer stage.

6. The method of claim 1, wherein moving the wafer stage to the second station on the table body comprises:
when the wafer stage is at the first station, emitting a second modulated laser beam, which carries a position control signal, from the first laser emitter toward the first beam splitter on the first sidewall of the wafer stage;
receiving the second modulated laser beam transmitting through the first beam splitter by the first sensor in the wafer stage; and
based on the position control signal carried by the received second modulated laser beam, moving the wafer stage.

7. The method of claim 1, further comprising:
emitting a second modulated laser beam, which carries a liquid delivery control signal, from the first laser emitter toward the first beam splitter on the first sidewall of the wafer stage;
receiving the second modulated laser beam transmitting through the first beam splitter by the first sensor in the wafer stage; and
based on the liquid delivery control signal carried by the received second modulated laser beam, introducing a liquid into the wafer stage.

8. A method, comprising:
moving a wafer stage to a first station on a table body of a lithography chamber;
placing a wafer on a top surface of the wafer stage;
emitting a first modulated laser beam from a first laser emitter toward a first beam splitter on a first sidewall of the wafer stage;
receiving a first portion of the first modulated laser beam transmitting through the first beam splitter by a first sensor in the wafer stage;
in response to the received first portion of the first modulated laser beam, moving the wafer stage from the first station to a second station on the table body;
performing a lithography process to the wafer when the wafer stage is at the second station
emitting a second modulated laser to the first sensor in the wafer stage through the first beam splitter on the first sidewall of the wafer stage; and
in response to the second modulated laser, introducing water into the wafer stage.

9. The method of claim 8, further comprising:
emitting a first unmodulated laser beam from the first laser emitter toward the first beam splitter on the first sidewall of the wafer stage;
receiving, by a first stage positioning module, a second portion of the first unmodulated laser beam reflected by the first beam splitter; and
calculating a position of the wafer stage on a first axis based on the received second portion of the first unmodulated laser beam.

10. The method of claim 9, further comprising:
emitting a second unmodulated laser beam from a second laser emitter toward a second beam splitter on a second sidewall of the wafer stage;
receiving, by a second sensor above the wafer stage, a portion of the second unmodulated laser beam reflected by the second beam splitter; and
calculating a position of the wafer stage on a second axis.

11. The method of claim 10, wherein an incident surface of the first beam splitter is substantially vertical to the top surface of the wafer stage, and an incident surface of the second beam splitter is tilted about 45° relative to the top surface of the wafer stage.

12. The method of claim 8, further comprising:
emitting a third modulated laser to the first sensor in the wafer stage through the first beam splitter on the first sidewall of the wafer stage; and
in response to the third modulated laser, ejecting a hydrogen gas out of the wafer stage, wherein the wafer is placed on the wafer stage after the step of ejecting the hydrogen gas is complete.

13. The method of claim 12, further comprising:
emitting a fourth modulated laser to the first sensor in the wafer stage through the first beam splitter on the first sidewall of the wafer stage; and
in response to the fourth modulated laser, ejecting a dry air out of the wafer stage.

14. A method, comprising:
moving a wafer stage to a first station on a table body of a lithography chamber;
placing a wafer on a top surface of the wafer stage;
determining a position of the wafer stage by emitting a first laser beam from a first laser emitter to a first sensor through a first beam splitter on a first sidewall of the wafer stage;
emitting a first modulated laser beam from the first laser emitter toward the first beam splitter, such that the first modulated laser beam has a reflected portion reflected by the first beam splitter and a transmitted portion transmitting through the first beam splitter;
receiving the transmitted portion of the first modulated laser beam by a second sensor inside the wafer stage;
in response to the received transmitted portion of the first modulated laser beam, moving the wafer stage from the first station to a second station on the table body; and
after moving the wafer stage from the first station to the second station, performing a lithography process to the wafer using a projection system above the wafer stage.

15. The method of claim 14, wherein an incident surface of the first beam splitter is substantially vertical to a top surface of the table body.

16. The method of claim 14, wherein an incident surface of the first beam splitter is tilted about 45° relative to a top surface of the table body.

17. The method of claim 14, wherein determining the position of the wafer stage further comprises:
emitting a second laser beam from a second laser emitter to a third sensor above the wafer stage through a second beam splitter on a second sidewall of the wafer stage adjacent to the first sidewall of the wafer stage; and
emitting a third laser beam from a third laser emitter to a fourth sensor through a third beam splitter on a third sidewall of the wafer stage opposite to the second sidewall of the wafer stage.

18. The method of claim 17, further comprising, after the lithography process is complete, introducing water into the wafer stage through a cable connected to a fourth sidewall of the wafer stage opposite to the first sidewall of the wafer stage.

19. The method of claim 14, wherein the first beam splitter is between an optical path between the first laser emitter and the second sensor.

20. The method of claim 14, wherein the second sensor has a sensing surface parallel to a sidewall of the wafer stage.

\* \* \* \* \*